(12) United States Patent
Kong et al.

(10) Patent No.: US 12,397,957 B2
(45) Date of Patent: Aug. 26, 2025

(54) LABEL FEEDER FOR HYBRID IRREGULAR COMPONENT INSERTION ROBOT

(71) Applicant: POWER AUTOMATION CO., LTD., Chungcheongnam-do (KR)

(72) Inventors: James Kong, Chungcheongnam-do (KR); Minki Do, Chungcheongnam-do (KR); Daechul Jung, Chungcheongnam-do (KR); Jangseon Hwang, Chungcheongnam-do (KR); Harkdo Maeng, Chungcheongnam-do (KR)

(73) Assignee: POWER AUTOMATION CO., LTD., Chungcheongnam-Do (KR)

( * ) Notice: Subject to any disclaimer, the term of this patent is extended or adjusted under 35 U.S.C. 154(b) by 69 days.

(21) Appl. No.: 18/242,064

(22) Filed: Sep. 5, 2023

(65) Prior Publication Data

US 2024/0076090 A1 Mar. 7, 2024

(30) Foreign Application Priority Data

Sep. 6, 2022 (KR) .................. 10-2022-0112954

(51) Int. Cl.
| | |
|---|---|
| *B65C 9/08* | (2006.01) |
| *B65C 1/02* | (2006.01) |
| *B65C 9/40* | (2006.01) |
| *B65C 9/42* | (2006.01) |
| *B65C 9/46* | (2006.01) |

(52) U.S. Cl.
CPC .................. *B65C 9/08* (2013.01); *B65C 1/02* (2013.01); *B65C 9/42* (2013.01); *B65C 9/46* (2013.01); *B65C 2009/402* (2013.01)

(58) Field of Classification Search
CPC .... B65C 9/08; B65C 1/02; B65C 9/42; B65C 9/46; B65C 2009/402; B65C 2009/0084
See application file for complete search history.

(56) References Cited

U.S. PATENT DOCUMENTS

2003/0121607 A1* 7/2003 Davis ................. H05K 13/0417
156/719

FOREIGN PATENT DOCUMENTS

| | | |
|---|---|---|
| CN | 210213039 U | 3/2020 |
| KR | 200373236 Y1 | 1/2005 |
| KR | 100579693 B1 | 5/2006 |
| KR | 101504520 B1 | 3/2015 |
| KR | 101600304 B1 | 3/2016 |
| KR | 101663784 B1 | 10/2016 |

OTHER PUBLICATIONS

EP 23194795 Search Opinion, published Jan. 26, 2024, for corresponding EP application (Year: 2024).*

* cited by examiner

*Primary Examiner* — George R Koch
(74) *Attorney, Agent, or Firm* — Harness, Dickey & Pierce, P.L.C.

(57) ABSTRACT

There is a provided a label feeder for a hybrid irregular component insertion robot, the label feeder includes: a label printer configured to print a label to be attached to a printed circuit board or an electronic component supplied from an electronic component supply unit to a hybrid irregular component insertion robot, and to enable the printed label to be published; and a label supply unit configured to take over the label being published from the label printer and supply the label to a label pickup position provided inside the hybrid irregular component insertion robot.

6 Claims, 6 Drawing Sheets

LABEL FEEDER FOR HYBRID IRREGULAR COMPONENT INSERTION ROBOT

CROSS-REFERENCE TO RELATED APPLICATIONS

This application claims the priority of Korean Patent Application No. 10-2022-0112954 filed on Sep. 6, 2022, in the Korean Intellectual Property Office, the disclosure of which is incorporated herein by reference.

FIELD

The present invention relates to a label feeder for a hybrid irregular component insertion robot that is capable of printing a label that is attached to a printed circuit board (PCB) or an electronic component, and supplying the printed and published label inside the hybrid irregular component insertion robot.

BACKGROUND

This section provides background information related to the present disclosure which is not necessarily prior art.

The printed circuit board (PCB), or electronic component mounted on the printed circuit board, is labeled for a variety of reasons, such as identifying individual components, controlling manufacturing process flow, or tracing production history.

However, in irregular component inserter, etc. that are conventionally operated in the form of an in-line configuration, the label is supplied by an automatic label supplier that is disposed between an electronic component supply device and irregular component mounting equipment, which causes problems in that the volume of the irregular component inserter increases, thereby reducing the utilization of a space where the irregular component inserter is installed.

In addition, since the automatic label supplier in the conventional irregular component inserter supplies the label for a specific printed circuit board or electronic component in a state of being printed identically in advance and wound in the form of a roll, the label needed to be replaced, in a state of stopping the operation of the irregular component inserter when a printed circuit board or electronic component is changed. Accordingly, there has been another problem with a decrease in productivity.

SUMMARY

An aspect of the present invention provides a label feeder for a hybrid irregular component insertion robot that is installed on a hybrid irregular component insertion robot.

An aspect of the present invention also provides a label feeder for a hybrid irregular component insertion robot that is capable of printing a label corresponding to a printed circuit board or electronic component supplied from an electronic component supply device to the hybrid irregular component insertion robot in real time, and supplying the printed and published label inside the hybrid irregular component insertion robot.

The problems to be solved by the present invention are not limited to the above-mentioned technical problems, and other technical problems, which are not mentioned above, may be clearly understood from the following descriptions by those skilled in the art to which the present invention pertains.

This section provides a general summary of the disclosure and is not a comprehensive disclosure of its full scope or all of its features.

According to an aspect of the present invention, there is provided a label feeder for a hybrid irregular component insertion robot, the label feeder may include: a label printer configured to print a label to be attached to a printed circuit board or an electronic component supplied from an electronic component supply unit to a hybrid irregular component insertion robot, and to enable the printed label to be published; and a label supply unit configured to take over the label being published from the label printer and supply the label to a label pickup position provided inside the hybrid irregular component insertion robot.

In the label feeder for the hybrid irregular component insertion robot according to an aspect of the present invention, the label printer may be installed on an exterior of one side of the hybrid irregular component insertion robot such that a label publishing opening through which the label is published faces the label pickup position.

In the label feeder for the hybrid irregular component insertion robot according to an aspect of the present invention, the label printer may further include a label publishing sensor, the label publishing sensor may be configured to enable the label printer to publish the label in conjunction with an operation of the label supply unit, in which the label publishing sensor may detect whether the label is present on an upper surface of a label saddle of the label supply unit when the label saddle of the label supply unit is moved to a label publishing position provided on a lower side of the label publishing opening, in which, when the label is not detected on the upper surface of the label saddle by the label publishing sensor, the label printer may publish a new label and settle the label on the upper surface of the label saddle, and in which, when a sensor interruption cylinder of the label supply unit blocks an area between the label publishing sensor and the label saddle, the label publishing sensor may determine that the label is settled on the upper surface of the label saddle, and the label printer may stop publishing the label.

In the label feeder for the hybrid irregular component insertion robot according to an aspect of the present invention, the label supply unit may include: a rodless cylinder having a slide table; and the label saddle mounted on the slide table and having an upper surface on which the label to be published by the label printer is settled, and in which the rodless cylinder may be installed horizontally between the label printer and the hybrid irregular component insertion robot so as to reciprocate the label saddle to the label publishing position and the label pickup position provided at a lower side of the label publishing opening of the label printer.

In the label feeder for the hybrid irregular component insertion robot according to an aspect of the present invention, the label saddle may be provided in the shape of a horizontal plate, in which a label detection sensor may be embedded inside the label saddle, the label detection sensor may be configured to detect the label settled on the upper surface of the label saddle and the label being picked up on the upper surface of the label saddle, in which, when the label detection sensor detects the label settled on the upper surface of the label saddle at the label publishing position, the rodless cylinder may move the label saddle to the label pickup position so that the label pickup robot provided inside the hybrid irregular component insertion robot picks up the label settled on the label saddle, and in which, when the label detection sensor detects the pickup of the label at the label pickup position, the rodless cylinder may move the label saddle to the label publishing position so that the rodless cylinder takes over a newly published label.

In the label feeder for the hybrid irregular component insertion robot according to an aspect of the present invention, the label supply unit may include the sensor interruption cylinder configured to interrupt the label publishing sensor of the label printer in conjunction with the label detection sensor to prevent the label from being further published, in which the sensor interruption cylinder may be installed on a support bracket provided on one side of a frame supporting the rodless cylinder so as to extend the cylinder rod toward the label publishing sensor and return the extended cylinder rod away from the label publishing sensor, and in which a shielding bracket in the shape of a horizontal plate may be mounted on an extended end side of the cylinder rod to block an area between the label saddle and the label publishing sensor when the cylinder rod is extended.

In the label feeder for the hybrid irregular component insertion robot according to an aspect of the present invention, the sensor interruption cylinder may extend the cylinder rod when the label detection sensor detects the label settled on the label saddle, so that the shielding bracket blocks an area between the label publishing sensor and the label saddle and prevents the label from being further published by the label printer, and in which, when the label saddle with the label settled thereon moves back to the label publishing position via the label pickup position, the sensor interruption cylinder may return the cylinder rod to enable the label publishing sensor to detect whether the label is present on the upper surface of the label saddle.

In the label feeder for the hybrid irregular component insertion robot according to an aspect of the present invention, the upper surface of the label saddle may be embossed or knurled in a dot shape.

According to the present invention, since the label feeder is installed on the hybrid irregular component insertion robot, it is possible to reduce the volume of the irregular component inserter, thereby providing the effect of increasing the utilization of the space in which the irregular component inserter is installed.

According to the present invention, since the label feeder supplies the label to the label pickup position provided inside the hybrid irregular component insertion robot, it is possible to significantly reduce the travel distance of the label pickup robot, as well as to provide the effect of reducing the process time for label attachment.

According to the present invention, since the label can be printed in real time, it is not necessary to stop the operation of the hybrid irregular component insertion robot even though a printed circuit board or an electronic component supplied to the hybrid irregular component insertion robot is changed, and accordingly, it is possible to provide the effect of increasing productivity.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Exemplary embodiments a label feeder for a hybrid irregular component insertion robot according to the present invention will now be described in detail with reference to the accompanying drawings.

However, it should be noted that the intrinsic technical spirit of the present invention is not limited by the following exemplary embodiment, and the following exemplary embodiment may easily be substituted or altered by those skilled in the art based on the intrinsic technical spirit of the present invention.

In addition, the terms used herein are selected for convenience of description and should be appropriately interpreted as a meaning that conform to the technical spirit of the present invention without being limited to a dictionary meaning when recognizing the intrinsic technical spirit of the present invention.

Figure 1:
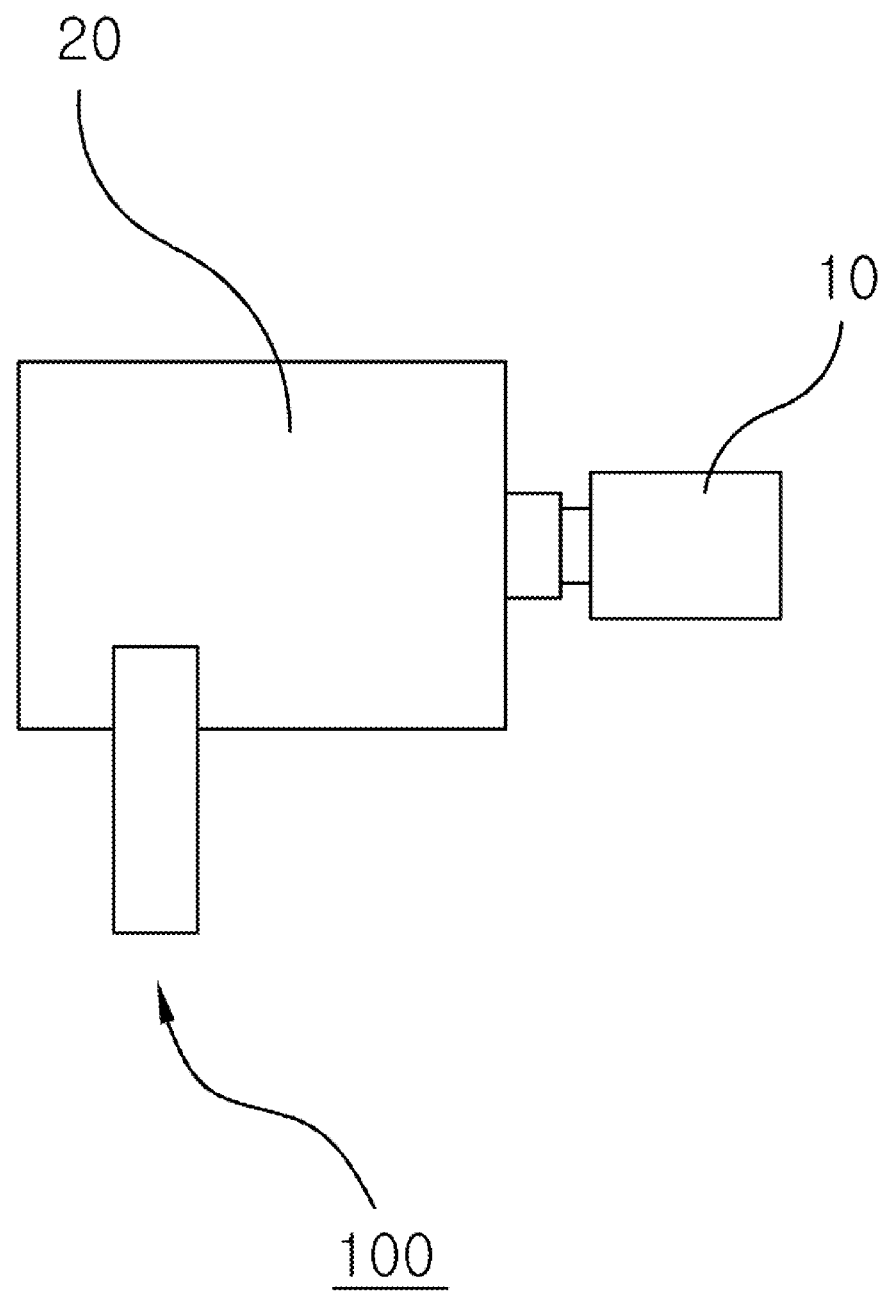
FIG. 1 is a view schematically illustrating an installation state of a label feeder for a hybrid irregular component insertion robot according to the present invention.
Figure 2:
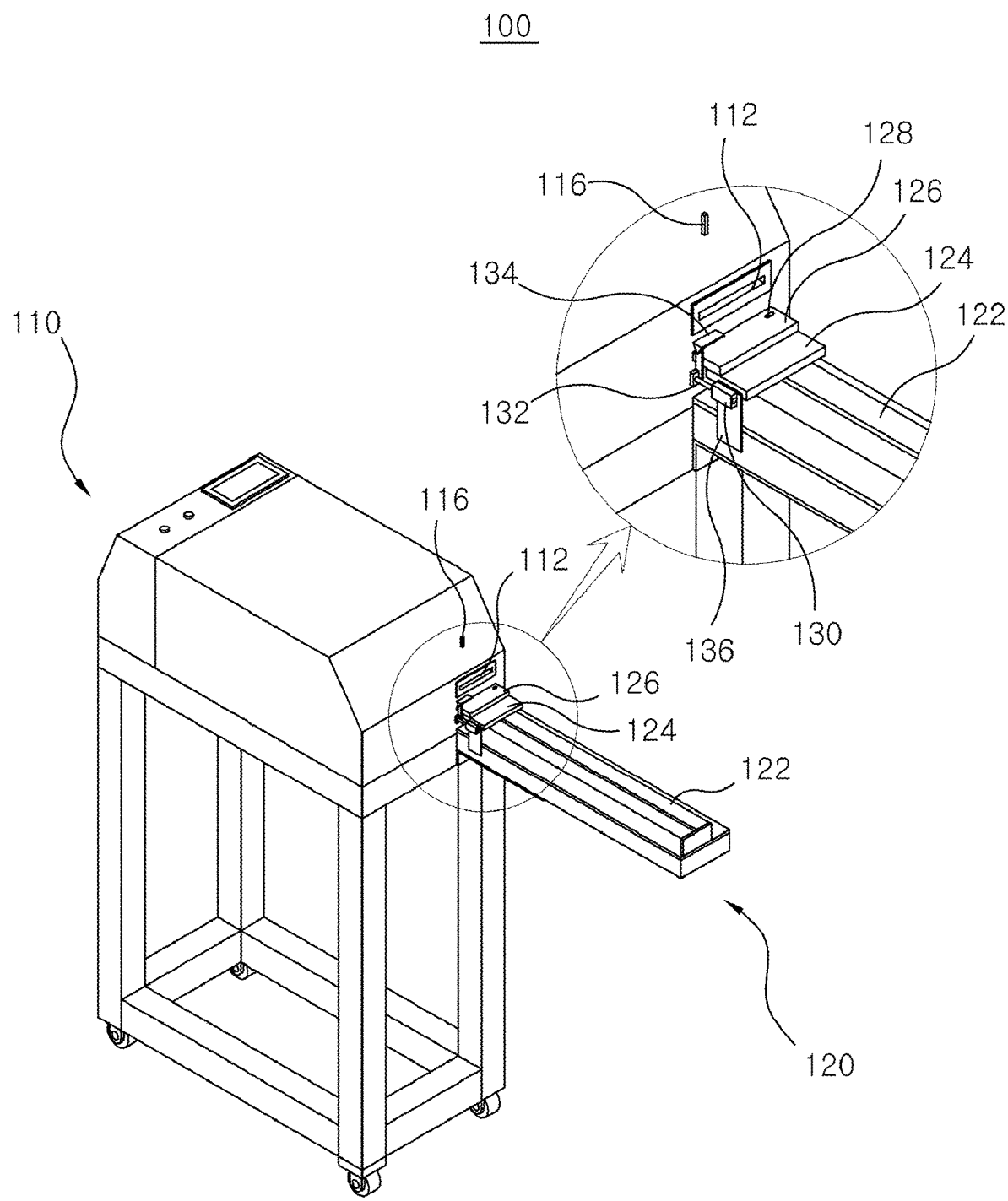
FIG. 2 is a view illustrating the label feeder for a hybrid irregular component insertion robot according to the present invention illustrated in FIG. 1.

Among the accompanying drawings, FIG. 1 is a view schematically illustrating an installation of a label feeder for a hybrid irregular component insertion robot according to the present invention.

With reference to FIG. 1, a label feeder 100 for a hybrid irregular component insertion robot according to the present invention is installed on one side of a hybrid irregular component insertion robot 20 so as not to interfere with a printed circuit board (not illustrated) or an electronic component (not illustrated) supplied from the electronic component supply device 10 to the hybrid irregular component insertion robot 20.

That is, the label feeder 100 for the hybrid irregular component insertion robot according to the present invention is not installed between the electronic component supply device 10 and the hybrid irregular component insertion robot 20 as in conventional practice, but is installed on one side of the hybrid irregular component insertion robot 20, thereby making it possible to increase the utilization of a space in which the hybrid irregular component insertion robot 20 is installed.

In addition, since the label feeder 100 for the hybrid irregular component insertion robot according to the present invention supplies a published label (L; see FIG. 4) to a label pickup position provided inside the hybrid irregular component insertion robot 20, it is possible to significantly reduce a travel distance of a label pickup robot (not illustrated), thereby shortening the process time for label attachment.

Among the accompanying drawings, FIGS. 2 to 6 are views illustrating the label feeder for the hybrid irregular component insertion robot according to the present invention.

With reference to FIGS. 2 to 6, the label feeder 100 for the hybrid irregular component insertion robot according to the present invention includes a label printer 110 and a label supply unit 120.

First, the label printer 110 prints a label L (see FIG. 4) that is attached to a printed circuit board or electronic component supplied to the hybrid irregular component insertion robot 20, and allows the printed label L to be published.

The label printer 110 is installed on an exterior of one side of the hybrid irregular component insertion robot 20 such that a label publishing opening 112, through which the label L is published, faces the label pickup position provided on an interior of the hybrid irregular component insertion robot 20.

The label printer 110 installed as described above prints the label L attached to the printed circuit board or electronic component supplied to the hybrid irregular component insertion robot 20 from the electronic component supply device 10 (see FIG. 1) in real time, and publishes the printed label L through the label publishing opening 112 so that the printed label L may be supplied to the hybrid irregular component insertion robot 20.

Here, the label L published by the label printer 110 may be printed with a conventional QR code or a conventional bar code including various information such as identification of each component or production history, and one or more of the labels L may be printed and published simultaneously in a transverse direction.

The label printer 110 that prints and publishes the label L in this manner is the known art, and the present invention does not specifically limit any configuration of the label printer 110.

In other words, the label printer 110 may have any configuration as long as the label printer 110 is capable of printing the preset information, i.e., a QR code or a conventional bar code corresponding to a printed circuit board or electronic component, on the label L and publishing the label L through the label publishing opening 112 with the label L in a state of being detached from a release paper (not illustrated).

Meanwhile, the label printer 110 further includes a label publishing sensor 116 that enables the label printer 110 to publish the label L in conjunction with the operation of the label supply unit 120.

The label publishing sensor 116 detects whether the label L is in a label publishing position, that is, on an upper surface of a label saddle 126 of the label supply unit 120 that has been moved to a lower side of the label publishing opening 112.

To this end, the label publishing sensor 116 is fixedly installed on the label printer 110 so as to be directed toward the upper surface of the label saddle 126, which has been moved to the label publishing position, as illustrated.

For example, the label publishing sensor 116 may be fixedly mounted to be directed toward the label publishing position by means of a frame (not illustrated) or the like extending from the label printer 110 so as not to interfere with the label L being published.

The label publishing sensor 116 installed in this manner detects whether there is the label L on the upper surface of the label saddle 126 moved to the label publishing position as described above to take over the label L to be published by the label printer 110. When the label L is not detected on the upper surface of the label saddle 126 moved to the label publishing position, the label printer 110 publishes a new label L, and the newly published label L is settled on the label saddle 126.

In contrast, when the label publishing sensor 116 detects the label L on the upper surface of the label saddle 126 that has been moved to the label publishing position, or when the label publishing sensor 116 and the label saddle 126 are interrupted by a sensor interruption cylinder 130 of the label supply unit 120 described below, the label printer 110 stops publishing the label L.

As described above, the label publishing sensor 116, which detects whether there is the label L and converts the detection into a signal and transmits the signal to the label printer 110, is not particularly limited in the present invention.

For example, the label publishing sensor 116 may be a conventional photoelectric sensor having a light emitting portion that emits light and a light receiving portion that receives light, and the label publishing sensor 116 may detect whether the label L is present or absent by detecting a change in the amount of light reaching the light receiving portion.

That is, the label publishing sensor 116 determines that the label L has settled on the upper portion of the label saddle 126 when the amount of light reaching the light receiving portion is greater than a preset amount.

The label supply unit 120 supplies the label L published by the label printer 110 to the label pickup position provided inside the hybrid irregular component insertion robot 20.

To this end, the label supply unit 120 includes the label saddle 126 and a conventional rodless cylinder 122.

The rodless cylinder 122 is the known art, and includes, as will be apparent to those skilled in the art, a slide table 124.

In this case, the rodless cylinder 122 is installed horizontally between the label printer 110 and the hybrid irregular component insertion robot 20 to enable reciprocating movement of the slide table 124 to the label publishing position and the label pickup position.

Further, the slide table 124 is mounted with the label saddle 126, as illustrated.

Here, the configuration and operation of the rodless cylinder 122, which reciprocates the slide table 124, is the known art, and a detailed description thereof is omitted.

The label saddle 126 is mounted on the slide table 124 of the rodless cylinder 122 as described above, and is provided in the shape of a roughly horizontal plate with a sufficient area to settle the label L being published by the label printer 110.

The label saddle 126 reciprocates along the slide table 124 to the label publishing position and the label pickup position, in which the label L to be published by the label printer 110 is settled on the upper surface of the label saddle 127 moved to the label publishing position, and the label pickup robot picks up the label L when the label saddle 126 with the label L settled is moved to the label pickup position.

Further, a label detection sensor 128 is embedded inside the label saddle 126 to detect the label L being settled and picked up on the upper surface of the label saddle 126.

That is, when the label detection sensor 128 detects that the label L is settled on the upper surface of the label saddle 126 that has been moved to the label publishing position, the rodless cylinder 122 moves the slide table 124 to the label pickup position, whereby the label saddle 126 with the label L settled thereon is moved along the slide table 124 to the label pickup position.

In contrast, when the label detection sensor 128 detects that the label L has been picked up by the label pickup robot in the label pickup position, the rodless cylinder 122 moves the slide table 124 to the label publishing position, whereby the label saddle 126 with the label L picked up is moved along the slide table 124 to the label publishing position to take over the label L being published by the label printer 110.

Here, the label detection sensor 128 embedded in the label saddle 126 is not particularly limited in the present invention.

That is, the label detection sensor 128 may employ any sensor known in the art as long as the label detection sensor 128 is capable of detecting the label L being settled on and picked up by the label saddle 126.

Preferably, the upper surface of the label saddle 126 may be provided to be embossed or knurled in a dot shape to minimize an adhesive area with an adhesive layer of the label L.

Meanwhile, the label supply unit 120 further includes the sensor interruption cylinder 130, which interrupts the label publishing sensor 116 to prevent the label L from being further published in conjunction with the label detection sensor 128.

The sensor interruption cylinder 130 is mounted on a support bracket 136 provided on one side of a frame supporting the rodless cylinder 122 so as not to interfere with the movement of the label saddle 126, as illustrated.

The sensor interruption cylinder 130 installed on the support bracket 136 in this manner extends a cylinder rod 132 toward the label publishing sensor 116 and returns the extended cylinder rod 132 away from the label publishing sensor 116, in which a shielding bracket 134 in the form of a horizontal plate is mounted on an extended end of the cylinder rod 132 to block an area between the label publishing sensor 116 and the label saddle 126 when the cylinder rod 132 is extended.

In other words, the shielding bracket 134 of the sensor interruption cylinder 130 blocks an area between the label publishing sensor 116 and the label saddle 126 to increase the amount of reflected light reaching the light receiving portion of the label publishing sensor 116. When the amount of reflected light reaching the light receiving portion of the label publishing sensor 116 is greater than a preset amount, the label publishing sensor 116 determines that the label L is settled on the upper surface of the label saddle 126, and accordingly, the label printer 110 prevents the label L from being published further.

That is, the sensor interruption cylinder 130 extends the cylinder rod 132 when the label detection sensor 128 detects the label L settled on the label saddle 126. In this case, the shielding bracket 134 mounted on the extended end of the cylinder rod 132 blocks an area between the label publishing sensor 116 and the label saddle 126 to prevent the label L from being further published by the label printer 110.

Further, when the label saddle 126 with the label L settled thereon moves (returns) to the label publishing position via the label pickup position, the sensor interruption cylinder 130 simultaneously makes the cylinder rod 132 return so that the label publishing sensor 116 may detect whether the label L is present on the upper surface of the label saddle 126.

An operation state of the label feeder 100 for the hybrid irregular component insertion robot according to the present invention is briefly described below.

Figure 3:
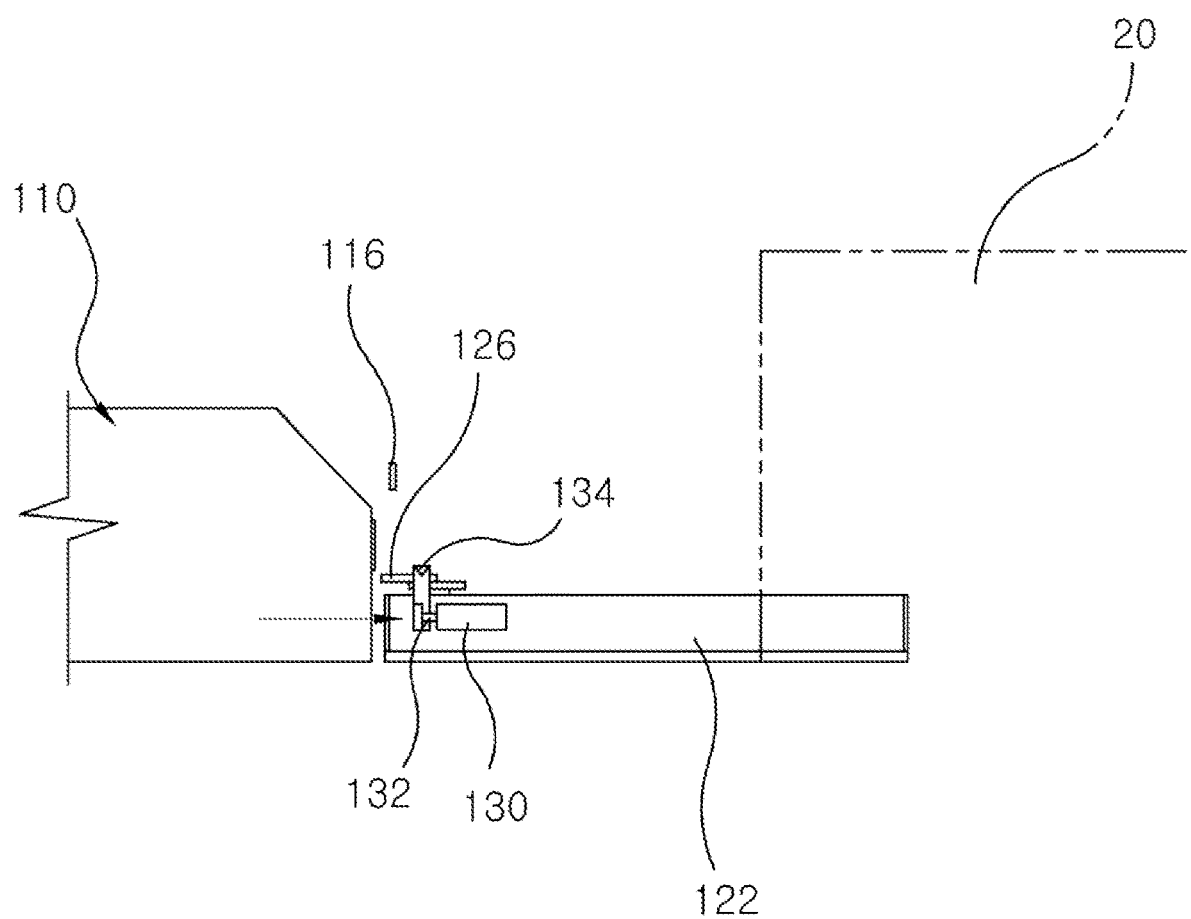
FIGS. 3, 4, 5 and 6 are views schematically illustrating an operating state of the label feeder for a hybrid irregular component insertion robot according to the present invention.

First, when the rodless cylinder 122 moves the label saddle 126 to the label publishing position, the sensor interruption cylinder 130 returns the cylinder rod 132 (see FIG. 3).

In this case, the shielding bracket 134 of the sensor interruption cylinder 130, which blocked an area between the label publishing sensor 116 and the label saddle 126, is returned along the cylinder rod 132, and at the same time, the label publishing sensor 116 detects whether the label L is present on the upper surface of the label saddle 126.

Figure 4:
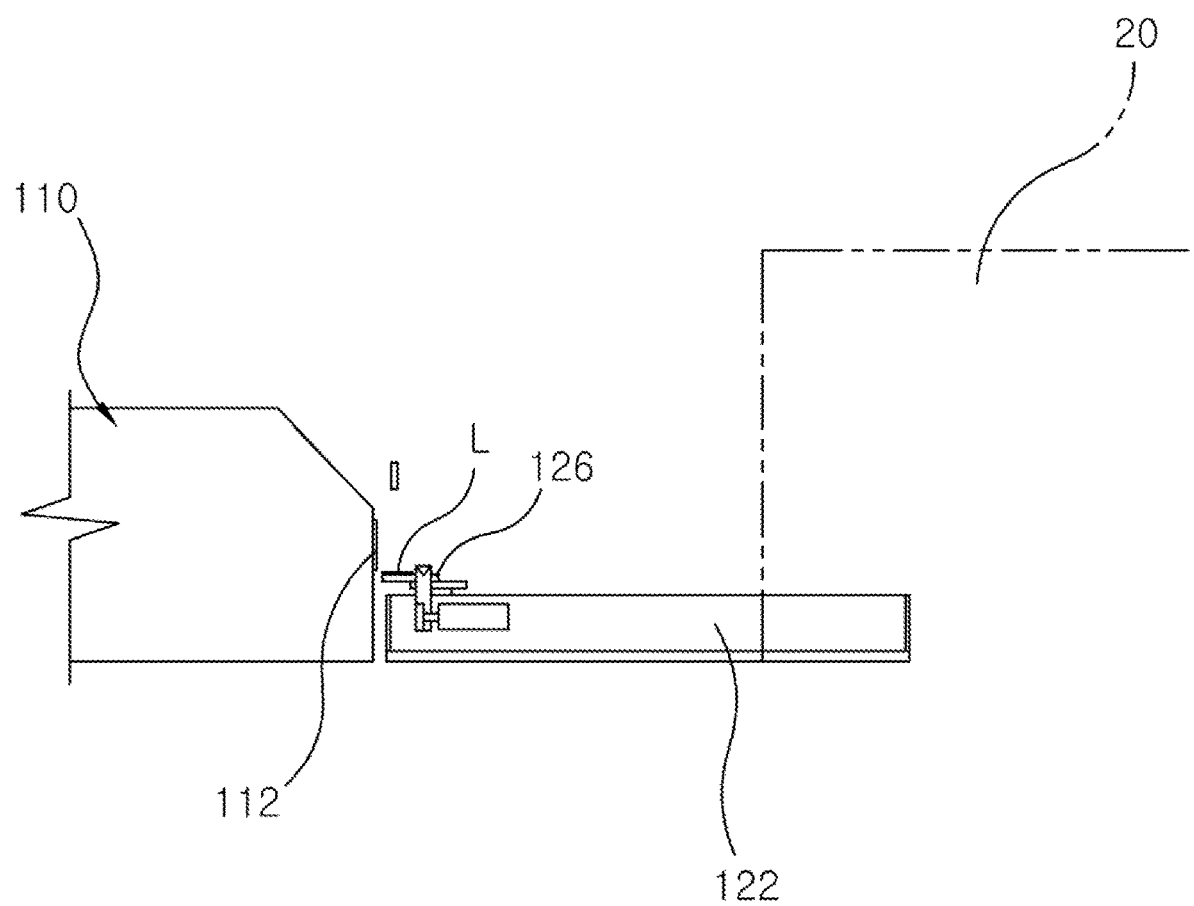

Further, when no label L is detected on the upper surface of the label saddle 126, the label printer 110 publishes a new label L, in which case the label L published through the label publishing opening 112 is settled on the upper surface of the label saddle 126 (see FIG. 4).

As described above, when the label L is settled on the upper surface of the label saddle 126, this is detected by the label detection sensor 128. When the label detection sensor 128 detects the label L settled on the upper surface of the label saddle 126, the sensor interruption cylinder 130 extends the cylinder rod 132 such that the shielding bracket 134 may block an area between the label publishing sensor 116 and the label saddle 126 (see FIG. 5).

Figure 5:
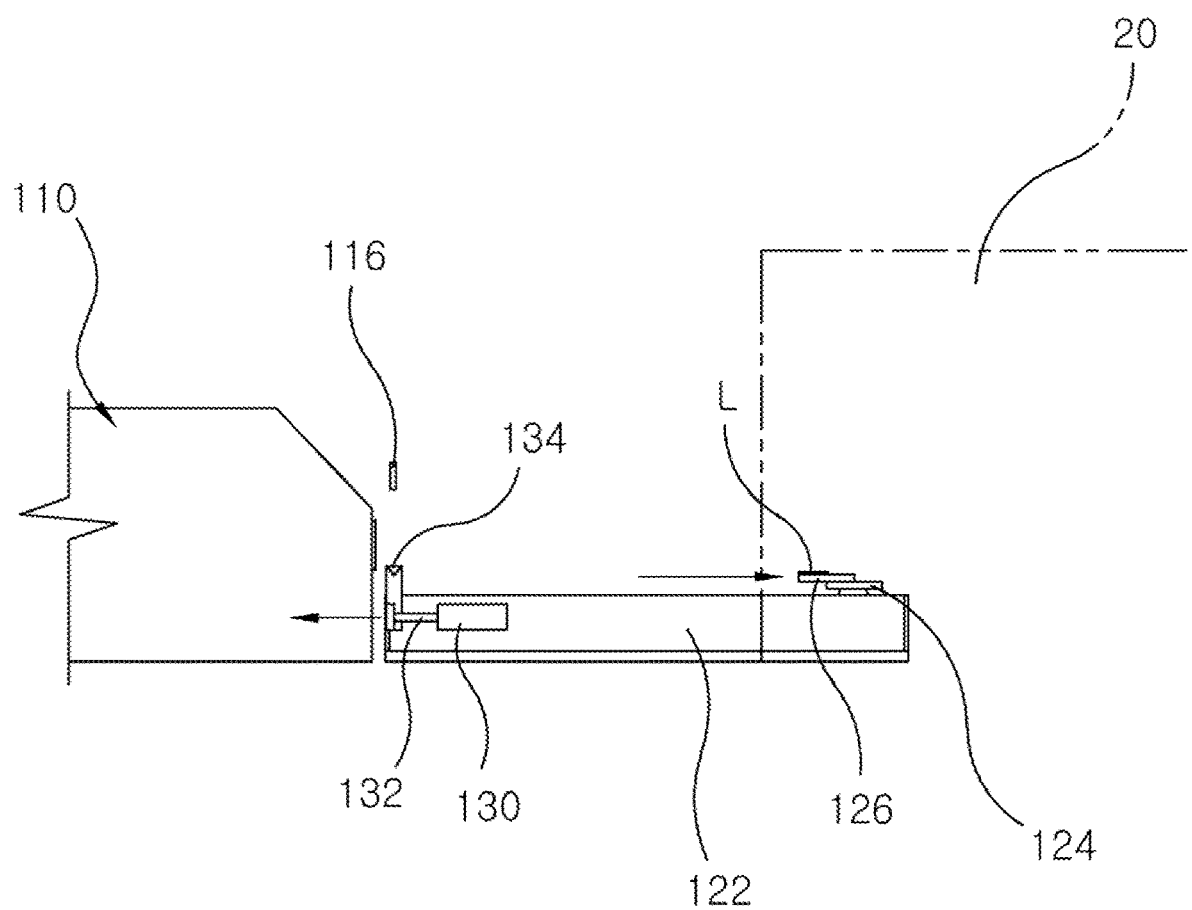
Figure 6:
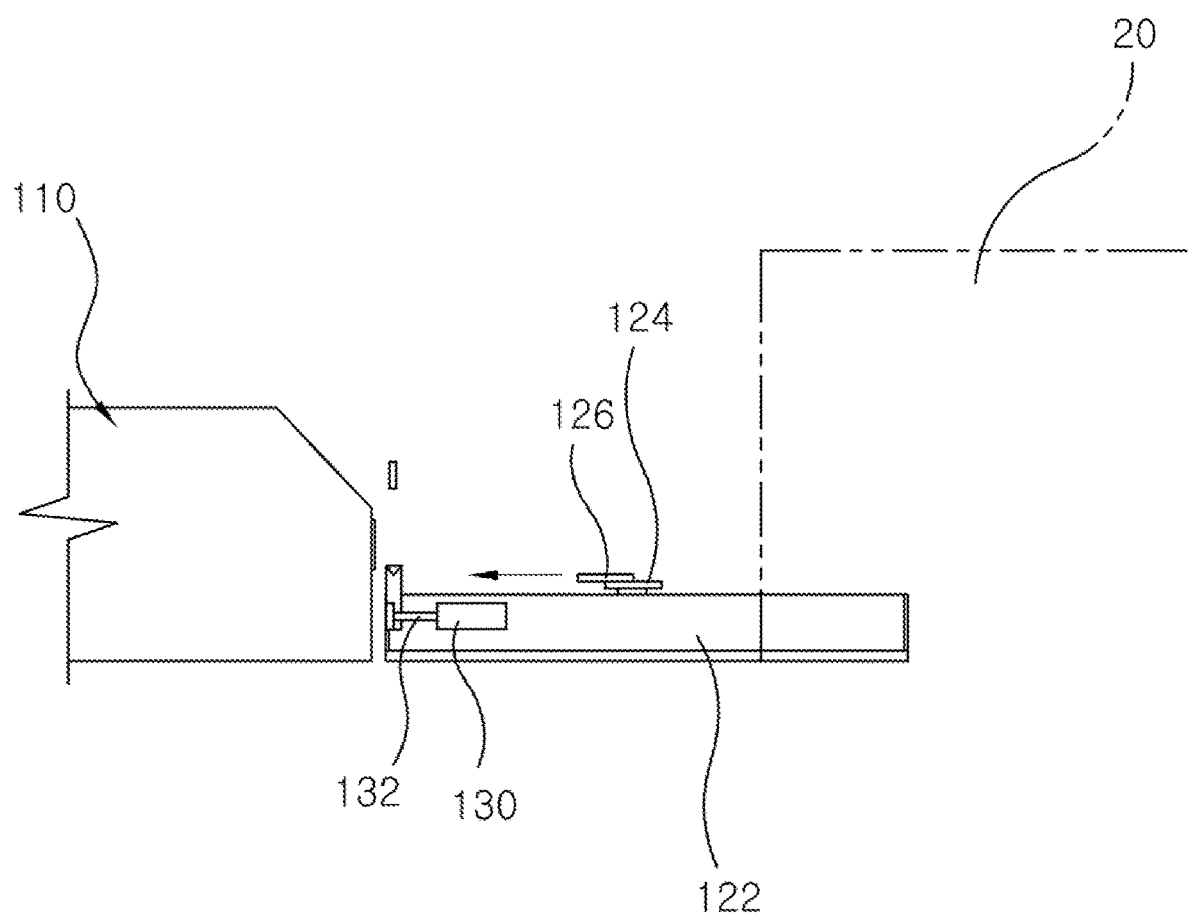

Further, when the shielding bracket 134 blocks an area between the label publishing sensor 116 and the label saddle 126, the rodless cylinder 122 moves the label saddle 126 with the label L settled thereon to the label pickup position provided inside the hybrid irregular component insertion robot 20 (see FIG. 5).

Meanwhile, when the label pickup robot picks up the label L settled on the upper surface of the label saddle 126 moved to the label pickup position, this is detected by the label detection sensor 128. In this case, the rodless cylinder 122 moves the label saddle 126 to the label publishing position (see FIG. 6), and when the label saddle 126 is moved to the label publishing position, the aforementioned operation is repeated.

As set forth above, according to exemplary embodiments of the invention, the label feeder 100 for the hybrid irregular component insertion robot can reduce the volume of the irregular component inserter because the label feeder 100 is installed on the hybrid irregular component insertion robot 20, thereby making it possible to increase the utilization of the space in which the irregular component inserter is installed.

Since the label feeder 100 for the hybrid irregular component insertion robot according to the present invention supplies the label L to the label pickup position provided inside the hybrid irregular component insertion robot 20, it is possible to significantly reduce a travel distance of the label pickup robot, as well as shorten the process time for label attachment.

Since the label feeder 100 for the hybrid irregular component insertion robot can output the label L in real time, it is not necessary to stop the operation of the hybrid irregular component insertion robot 20 even though a printed circuit board or an electronic component supplied to the hybrid irregular component insertion robot 20 is changed, thereby increasing productivity.

While the present disclosure has been shown and described in connection with the exemplary embodiments, it will be apparent to those skilled in the art that modifications and variations can be made without departing from the spirit and scope of the disclosure as defined by the appended claims.

What is claimed is:

1. A label feeder for a hybrid irregular component insertion robot, the label feeder comprising:
    a label printer configured to print a label to be attached to a printed circuit board or an electronic component to a hybrid irregular component insertion robot, and to enable the printed label to be published; and
    a label supply unit configured to take over the label being published from the label printer and supply the label to the hybrid irregular component insertion robot,
    wherein the label printer is configured to be installed on the hybrid irregular component insertion robot,
    wherein the label printer further comprises a label publishing sensor, the label publishing sensor configured to enable the label printer to publish the label in conjunction with an operation of the label supply unit, wherein the label publishing sensor detects whether the label is present on an upper surface of a label saddle of the label supply unit when the label saddle of the label supply unit is moved to a label publishing position provided on a lower side of a label publishing opening, wherein, when the label is not detected on the upper surface of the label saddle by the label publishing sensor, the label printer publishes a new label and settles the label on the upper surface of the label saddle, and wherein, when a sensor interruption cylinder of the label supply unit blocks an area between the label publishing sensor and the label saddle, the label publishing sensor determines that the label is settled on the upper surface of the label saddle, and the label printer stops publishing the label.

2. The label feeder of claim 1, wherein the label supply unit comprises:
   a rodless cylinder having a slide table; and
   the label saddle mounted on the slide table and having the upper surface on which the label to be published by the label printer is settled, and
   wherein the rodless cylinder is installed horizontally between the label printer and the hybrid irregular component insertion robot.

3. The label feeder of claim 2, wherein the label saddle is provided in a shape of a horizontal plate,
   wherein a label detection sensor is embedded inside the label saddle, the label detection sensor configured to detect the label settled on the upper surface of the label saddle and the label being picked up on the upper surface of the label saddle,
   wherein, when the label detection sensor detects the label settled on the upper surface of the label saddle at the label publishing position, the rodless cylinder moves the label saddle to a label pickup position, and
   wherein, when the label detection sensor detects a pickup of the label, the rodless cylinder moves the label saddle to the label publishing position so that the rodless cylinder takes over a newly published label.

4. The label feeder of claim 3, wherein the label supply unit comprises the sensor interruption cylinder configured to interrupt the label publishing sensor of the label printer in conjunction with the label detection sensor to prevent the label from being further published,
   wherein the sensor interruption cylinder is installed on a support bracket provided on one side of a frame supporting the rodless cylinder so as to extend a cylinder rod toward the label publishing sensor and return the extended cylinder rod away from the label publishing sensor, and
   wherein a shielding bracket in the shape of a horizontal plate is mounted on an extended end side of the cylinder rod to block an area between the label saddle and the label publishing sensor when the cylinder rod is extended.

5. The label feeder of claim 4, wherein the sensor interruption cylinder extends the cylinder rod when the label detection sensor detects the label settled on the label saddle, so that the shielding bracket blocks an area between the label publishing sensor and the label saddle and prevents the label from being further published by the label printer, and
   wherein, when the label saddle with the label settled thereon moves to the label publishing position, the sensor interruption cylinder returns the cylinder rod to enable the label publishing sensor to detect whether the label is present on the upper surface of the label saddle.

6. The label feeder of claim 2, wherein the upper surface of the label saddle is embossed or knurled in a dot shape.

* * * * *